United States Patent  
Liu et al.

(10) Patent No.: US 9,349,682 B2  
(45) Date of Patent: May 24, 2016

(54) SEMICONDUCTOR CHIP AND SEMICONDUCTOR CHIP PACKAGE EACH HAVING SIGNAL PATHS THAT BALANCE CLOCK SKEWS

(71) Applicant: MediaTek Inc., Hsin-Chu (TW)

(72) Inventors: Der-Ping Liu, Dayuan Township, Taoyuan County (TW); Tai-You Lu, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 29 days.

(21) Appl. No.: 14/192,004

(22) Filed: Feb. 27, 2014

(65) Prior Publication Data

US 2015/0243595 A1 Aug. 27, 2015

(51) Int. Cl.
*H01L 23/498* (2006.01)
*H01L 23/528* (2006.01)
*H01L 23/00* (2006.01)
*G06F 1/10* (2006.01)
*H01L 23/552* (2006.01)
*H01L 25/065* (2006.01)

(52) U.S. Cl.
CPC ............ *H01L 23/49838* (2013.01); *G06F 1/10* (2013.01); *H01L 23/528* (2013.01); *H01L 23/552* (2013.01); *H01L 24/09* (2013.01); *H01L 24/17* (2013.01); *H01L 24/49* (2013.01); *H01L 25/0655* (2013.01); *H01L 2224/0401* (2013.01); *H01L 2224/49* (2013.01); *H01L 2924/00014* (2013.01)

(58) Field of Classification Search
CPC ............................................. H01L 2027/11877
See application file for complete search history.

(56) References Cited

U.S. PATENT DOCUMENTS

| 5,172,330 | A | 12/1992 | Watannabe et al. |
| 5,307,381 | A | 4/1994 | Ahuja |
| 5,430,397 | A | 7/1995 | Itoh et al. |
| 5,521,541 | A * | 5/1996 | Okamura ....................... 327/297 |
| 5,656,963 | A * | 8/1997 | Masleid et al. ................ 327/297 |
| 7,679,416 | B2 * | 3/2010 | Cheng et al. .................. 327/293 |
| 2002/0152409 | A1 * | 10/2002 | Chu et al. ...................... 713/320 |
| 2003/0099093 | A1 | 5/2003 | Kuzmenka |
| 2006/0290377 | A1 * | 12/2006 | Kim et al. ........................ 326/30 |
| 2007/0286323 | A1 * | 12/2007 | Shimobeppu ................. 375/376 |
| 2008/0115004 | A1 * | 5/2008 | Braun et al. ................... 713/401 |
| 2009/0125746 | A1 | 5/2009 | Rofougaran |
| 2011/0302540 | A1 * | 12/2011 | Kwon et al. ................... 716/100 |
| 2015/0063825 | A1 * | 3/2015 | Yamase .......................... 398/154 |
| 2015/0243610 | A1 * | 8/2015 | Zhang ............... H01L 23/49811 257/773 |

FOREIGN PATENT DOCUMENTS

| JP | 1990208956 | 8/1990 |
| JP | 5159080 A | 6/1993 |
| JP | 1993136125 | 6/1993 |
| JP | 1995146733 | 6/1995 |
| JP | 1996030655 | 2/1996 |
| JP | 2013157436 | 8/2013 |

* cited by examiner

*Primary Examiner* — Michael Jung
(74) *Attorney, Agent, or Firm* — McClure, Qualey & Rodack, LLP

(57) ABSTRACT

A semiconductor chip is provided. The semiconductor chip includes a first circuit, a second circuit, a third circuit, a first signal path and a second signal path. The first circuit provides a reference signal. The first signal path includes a first conductive trace and transmits the reference signal from the first circuit to the second circuit. The second signal path transmits the reference signal from the first circuit to the third circuit. Timing skews of the first and second signal paths are balanced and the first and second signal paths are routed globally.

19 Claims, 6 Drawing Sheets

US 9,349,682 B2

SEMICONDUCTOR CHIP AND SEMICONDUCTOR CHIP PACKAGE EACH HAVING SIGNAL PATHS THAT BALANCE CLOCK SKEWS

BACKGROUND OF THE INVENTION

1. Field of the Invention

The invention relates to a semiconductor chip, and more particularly, to balance timing skews of a semiconductor chip.

2. Description of the Related Art

In the modern high-speed very-large-scale integrated (VLSI) circuits, clock design plays a crucial role in determining chip performance and facilitating timing and design convergence. Clock routing is important in the layout design of a synchronous system since it influences function, area, speed, and power dissipation of the synthesized system. Therefore, minimization of timing skew of clock has been a critical problem for high-performance and high-speed circuits of VLSI design.

In general, clock tree synthesis (CTS) is performed to insert buffers to reduce timing skew and to construct a clock tree to reach an optimized solution by taking timing skew, circuit-area and power-consumption into considerations. However, the timing skew of the clock tree varies quite obviously for different process, temperature and voltage corners. For advanced technology, this effect becomes even worse. One way to deal with this problem is to use the proposed semiconductor chip and packages.

BRIEF SUMMARY OF THE INVENTION

A semiconductor chip and a semiconductor chip package for balancing timing skews are provided. An embodiment of a semiconductor chip is provided. The semiconductor chip comprises: a first circuit, providing a reference signal; a second circuit; a third circuit; a first signal path, comprising a first conductive trace and transmitting the reference signal from the first circuit to the second circuit; and a second signal path, transmitting the reference signal from the first circuit to the third circuit. Timing skews of the first and second signal paths are balanced and the first and second signal paths are routed globally.

Furthermore, an embodiment of a semiconductor chip package is provided. The semiconductor chip package comprises: a package substrate and a semiconductor chip. The package substrate comprises: a first contact pad; a second contact pad; and a third contact pad. The semiconductor chip is mounted on the package substrate. The semiconductor chip comprises: a first pad; a second pad; a third pad; a first circuit coupled to the first contact pad through the first pad and a first connection unit for providing a reference signal; a second circuit coupled to the second contact pad through the second pad and a second connection unit; and a third circuit coupled to the third contact pad through the third pad and a third connection unit. The package substrate further comprises: a first signal path, transmitting the reference signal from the first contact pad to the second contact pad; and a second signal path, transmitting the reference signal from the first contact pad to the third contact pad. The timing skews of the first and second signal paths are balanced.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
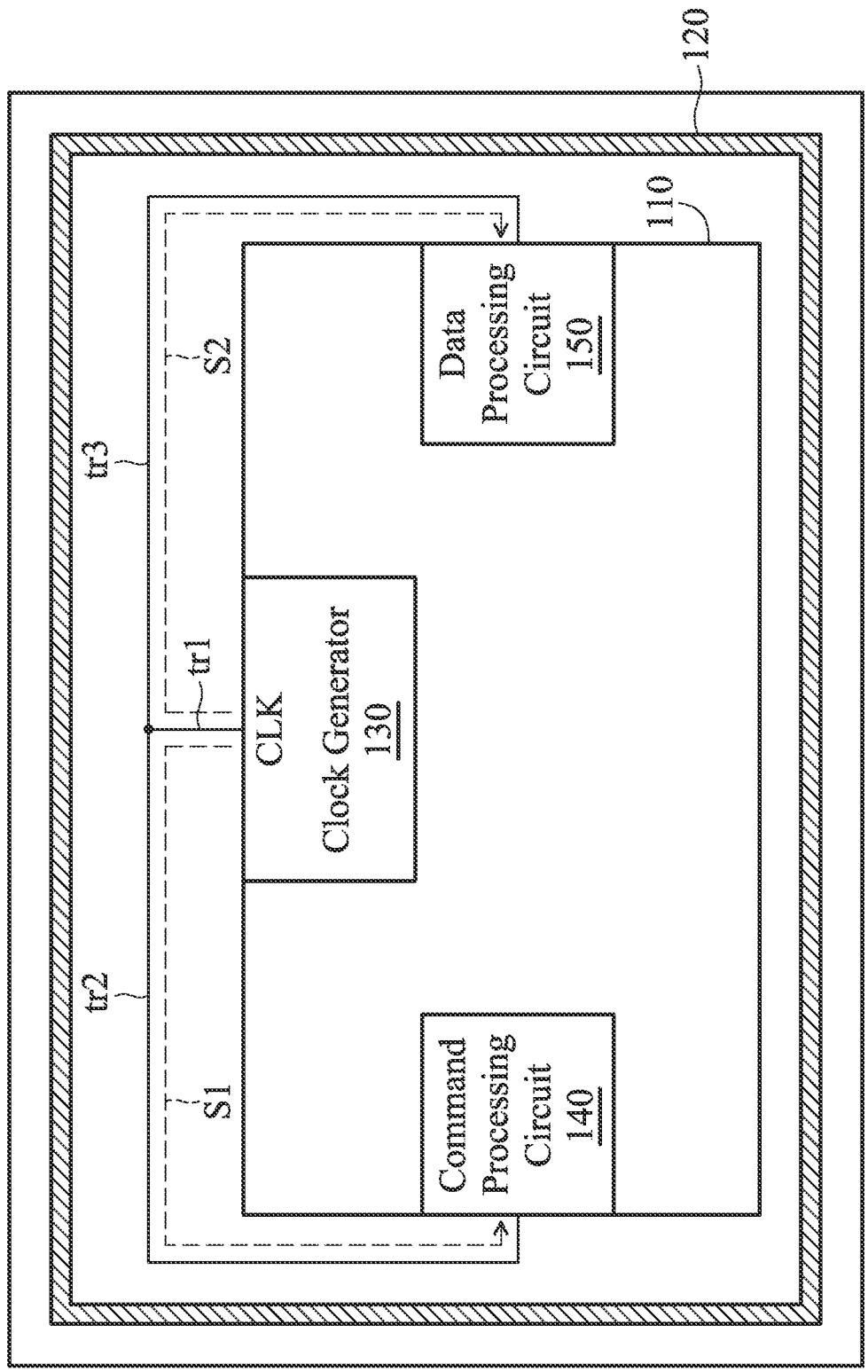
FIG. 1 shows a semiconductor chip according to an embodiment of the invention.

FIG. 1 shows a semiconductor chip 100 according to an embodiment of the invention. The semiconductor chip 100 includes an integrated circuit region 110, a shielding region 120 and the traces tr1, tr2 and tr3. The integrated circuit region 110 includes a clock generator 130, a command processing circuit 140 and a data processing circuit 150. In the embodiment, the command processing circuit 140 and the data processing circuit 150 are respectively used to process the command signals and the data signals for a memory device, such as a memory (LDDR2 or LDDR3). Furthermore, in the integrated circuit region 110, the command processing circuit 140 and the data processing circuit 150 are disposed at opposite edges, so as to conform to a pin sequence requirement of the memory device. For example, the command processing circuit 140 is disposed at the left side of the semiconductor chip 100, and the data processing circuit 150 is disposed at the right side of the semiconductor chip 100. The trace tr1 and the trace tr2 form a signal path S1, and the trace tr1 and the trace tr3 form a signal path S2, wherein the trace tr1 is a common section of the signal paths S1 and S2. In the embodiment, the clock generator 130 provides a reference clock CLK to the command processing circuit 140 via the signal path S1, and the clock generator 130 also provides the reference clock CLK to the data processing circuit 150 via the signal path S2. Specifically, the reference clock CLK is a clock source for the command processing circuit 140 and the data processing circuit 150, and the internal circuits of the command processing circuit 140 and the data processing circuit 150, such as Phase lock loops (PLLs), can generate a plurality of internal clock signals according to the reference clock CLK. It is to be noted that the traces tr1, tr2 and tr3 are disposed outside the integrated circuit region 110. Furthermore, the signal paths S1 and S2 are surrounded by the shielding region 120. For example, the signal paths S1 and S2 are disposed between the integrated circuit region 110 and the shielding region 120, so as to protect the reference clock CLK in the signal paths S1 and S2. In one embodiment, a first additional shielding region is disposed between the integrated circuit region 110 and the signal path S1, and a second additional shielding region is disposed between the integrated circuit region 110 and the signal path S2. Furthermore, in one embodiment, the traces tr1, tr2 and tr3 are implemented by the same conductive layer (e.g. a top metal layer), and the lengths of the signal paths S1 and S2 are substantially the same. Thus, timing skews of the signal paths S1 and S2 are balanced without clock tree synthesis, thereby decreasing design complexity and reducing design time. In another embodiment, the traces tr1, tr2 and tr3 are implemented by different conductive layers, and the impedances of the signal paths S1 and S2 are substantially matching. Specifically, the timing skews of the signal paths S1 and S2 are balanced and the signal paths S1 and S2 are routed globally. In other words, the signal paths S1 and S2 are generated by global routing. The term global routing is used to distinguish from local routing. For local routing, the scale of the route is quite small with respect to the scale of the chip and the route is typically within a functional block. For instance, one side of the chip may be of several millimeters (mm) in length whereas the length of the route may be several micrometers (um) and the route may connect an output of an adder to an input of another adder, where both adders belong to one functional unit for realizing an add operation. In contrast, the globally routing is typically concerned with routing across different major functional blocks or different clock domains of the chip. For a chip size of the order of millimeter square ($mm^2$), a global route may be several millimeters in length. Also, it has to be elaborated that the semiconductor chip 100 may be typically known as a die. According to semiconductor manufacturing technology, a wafer may be sliced into a plurality of dies. Inside a die, all the functional circuits are placed within a region and this region is referred to as an integrated circuit region in this embodiment. There is usually some margin area between the boundary of the die and the boundary of the integrated circuit region so as not to damage the functional circuits during wafer slicing. The shielding region 120, signal path S1 and signal path S2 may be placed within such margin area.

Note that disclosure in the previous paragraph shows an exemplary embodiment of the invention and there are other modifications that also fall within the scope of the invention. For instance, firstly, the clock generator 130 may be replaced by a reference signal generator, producing a reference signal not limited to clock signals. Besides, the command processing circuit 140 and the data processing circuit 150 may be replaced by a first circuit and a second circuit, respectively, not limited to execute command or data processing functionality. Secondly, the signal paths S1 and S2 are not necessarily outside the integrated circuit region 110 and either one may be routed thoroughly or partially within the integrated circuit region 110 as long as the routing constraints can still be met. Thirdly, the shielding region 120 is used to protect the signal paths S1 and S2 from interference for better signal quality and might be removed entirely or partially when interference is not strong. Fourthly, the signal paths S1 and S2 may be not overlapping with each other but two completely separate paths. And still another point to be noted is that the clock generator 130, the command processing circuit 140 and the data processing circuit may not all be placed in different sides of the integrated circuit region 110. Furthermore, neither does any of the three circuits needs to be placed on or near the boundary of the integrated circuit region 110.

Figure 2:
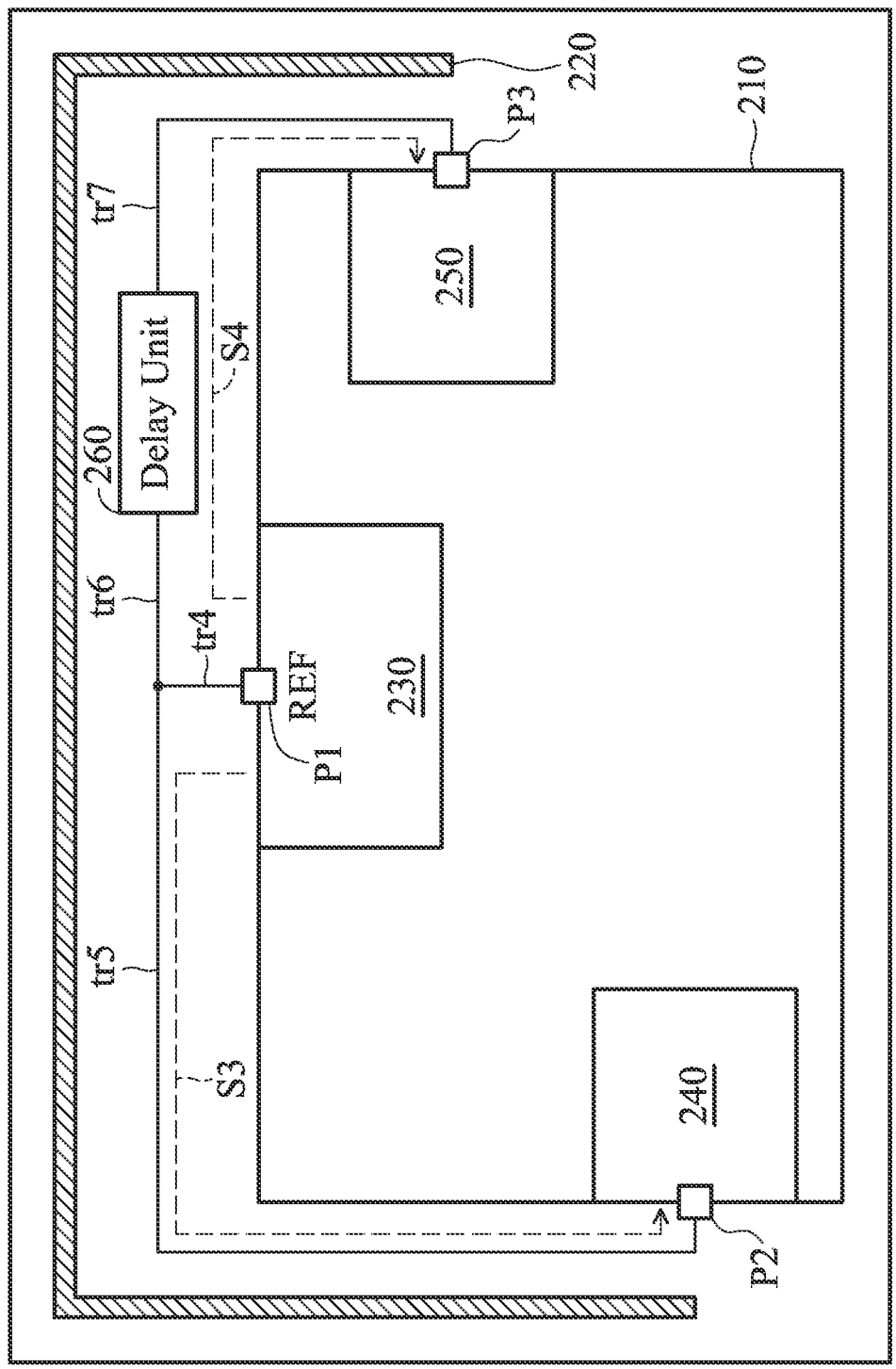
FIG. 2 shows a semiconductor chip according to another embodiment of the invention.

FIG. 2 shows a semiconductor chip 200 according to another embodiment of the invention. The semiconductor chip 200 includes an integrated circuit region 210, a shielding region 220, a delay unit 260 and the traces tr4, tr5, tr6 and tr7. The integrated circuit region 210 includes a first circuit 230, a second circuit 240 and a third circuit 250. In FIG. 2, a port P1 of the first circuit 230 is used to provide a reference signal REF to a port P2 of the second circuit 240 and a port P3 of the third circuit 250, wherein the second circuit 240 and the third circuit 250 are disposed on different edges of the integrated circuit region 210. Specifically, the second circuit 240 is separated from the third circuit 250. The reference signal REF is transmitted to the port P2 of the second circuit 240 from the port P1 of the first circuit 230 via a signal path S3, wherein the signal path S3 is formed by the traces tr4 and tr5. Furthermore, the reference signal REF is transmitted to the port P3 of the third circuit 250 from the port P1 of the first circuit 230 via a signal path S4, wherein the signal path S4 is formed by the trace tr4, the trace tr6, the delay unit 260 and the trace tr7. As described above, the trace tr4 is a common section of the signal paths S3 and S4. In the embodiment, a shortest distance between the ports P1 and P2 around the integrated circuit region 210 is longer than the shortest distance between the ports P1 and P3 around the integrated circuit region 210. Thus, the delay unit 260 is used to delay the transmission of the reference signal REF in the signal path S4, such that the reference signal REF can reach the port P2 of the second circuit 240 and the port P3 of the third circuit 250 simultaneously. Furthermore, the sum of the trace tr6 and the trace tr7 is shorter than the trace tr5. Moreover, the traces tr4, tr5, tr6 and tr7 can be implemented by the same conductive layer or different conductive layers, and the impedances of the signal paths S3 and S4 are substantially matching. Thus, timing skews of the signal paths S3 and S4 are balanced without clock tree synthesis, and the signal paths S3 and S4 are routed globally.

The previous paragraph shows the embodiment with the delay unit 260 and it has to be emphasized that other various modifications in light of the embodiments of the modifications in FIG. 1 may also be applied to the embodiment as shown in FIG. 2 when appropriate. In addition, the ports P1, P2, P3 may not be necessary and may be removed for some situations.

Figure 3A:
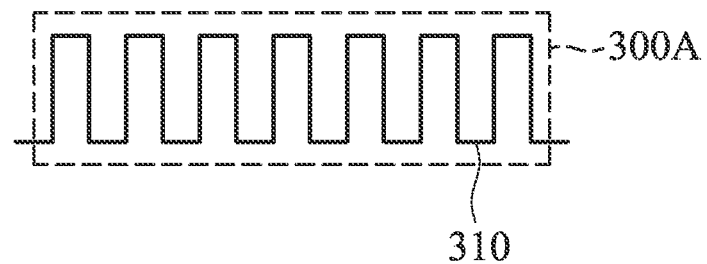
FIG. 3A shows a delay unit according to an embodiment of the invention.
Figure 3B:
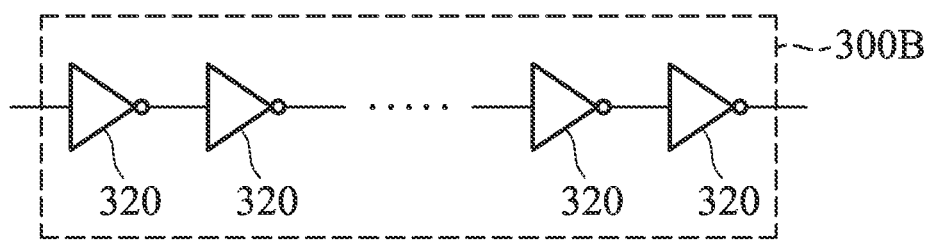
FIG. 3B shows a delay unit according to another embodiment of the invention.
Figure 3C:
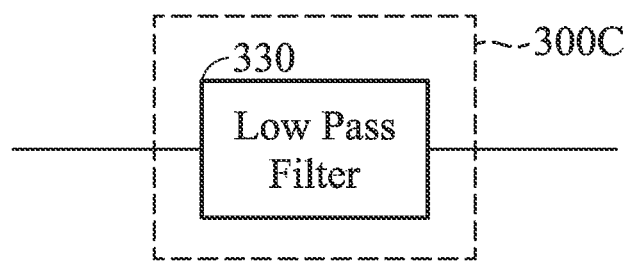
FIG. 3C shows a delay unit according to another embodiment of the invention.

FIG. 3A shows a delay unit 300A according to an embodiment of the invention. Referring to FIG. 2 and FIG. 3A together, the delay unit 300A includes a snake-shaped trace 310, which is a conductive line formed as a snake-shaped structure having a plurality of sections, wherein the quantity of the sections is determined according to the difference between the trace tr5 and the sum of the traces tr6 and tr7. As described, the traces tr4-tr7 and the snake-shaped trace 310 can be implemented by the same conductive layer or different conductive layers. FIG. 3B shows a delay unit 300B according to another embodiment of the invention. Referring to FIG. 2 and FIG. 3B together, the delay unit 300B is a buffer chain including a plurality of inverters 320, wherein a quantity of the inverters 320 is determined according to the difference between the trace tr5 and the propagation delay of the inverters 320. In the embodiment, the quantity of the inverters is even. In one embodiment, the buffer chain is formed by a plurality of buffers. FIG. 3C shows a delay unit 300C according to another embodiment of the invention. In FIG. 3C, the delay unit 300C is formed by a low pass filter 330.

Figure 4:
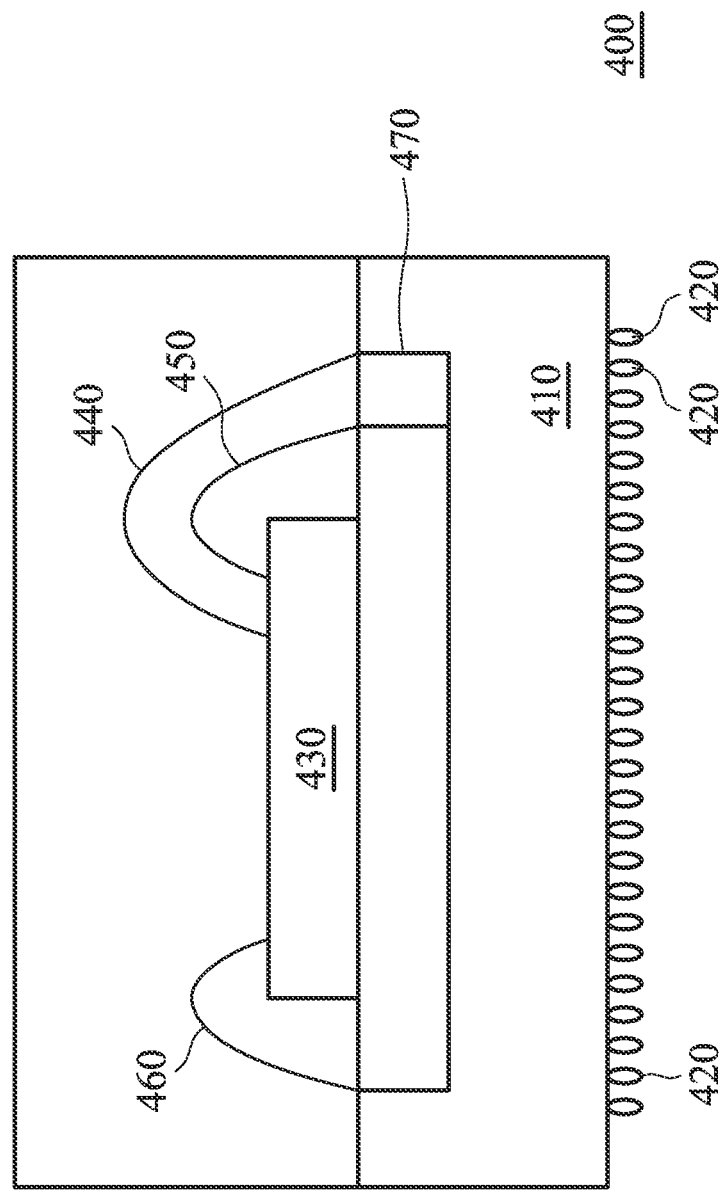
FIG. 4 shows a cross-sectional view of a semiconductor chip package according to an embodiment of the invention.

FIG. 4 shows a cross-section view of a semiconductor chip package 400 according to an embodiment of the invention. The semiconductor chip package 400 includes a package substrate 410, a plurality of pins 420, a semiconductor chip 430 mounted on the package substrate 410, the bonding wires 440, 450 and 460 and a transmission line 470, wherein the bonding wires 440, 450 and 460 are coupled to each other via the transmission line 470.

Figure 5:
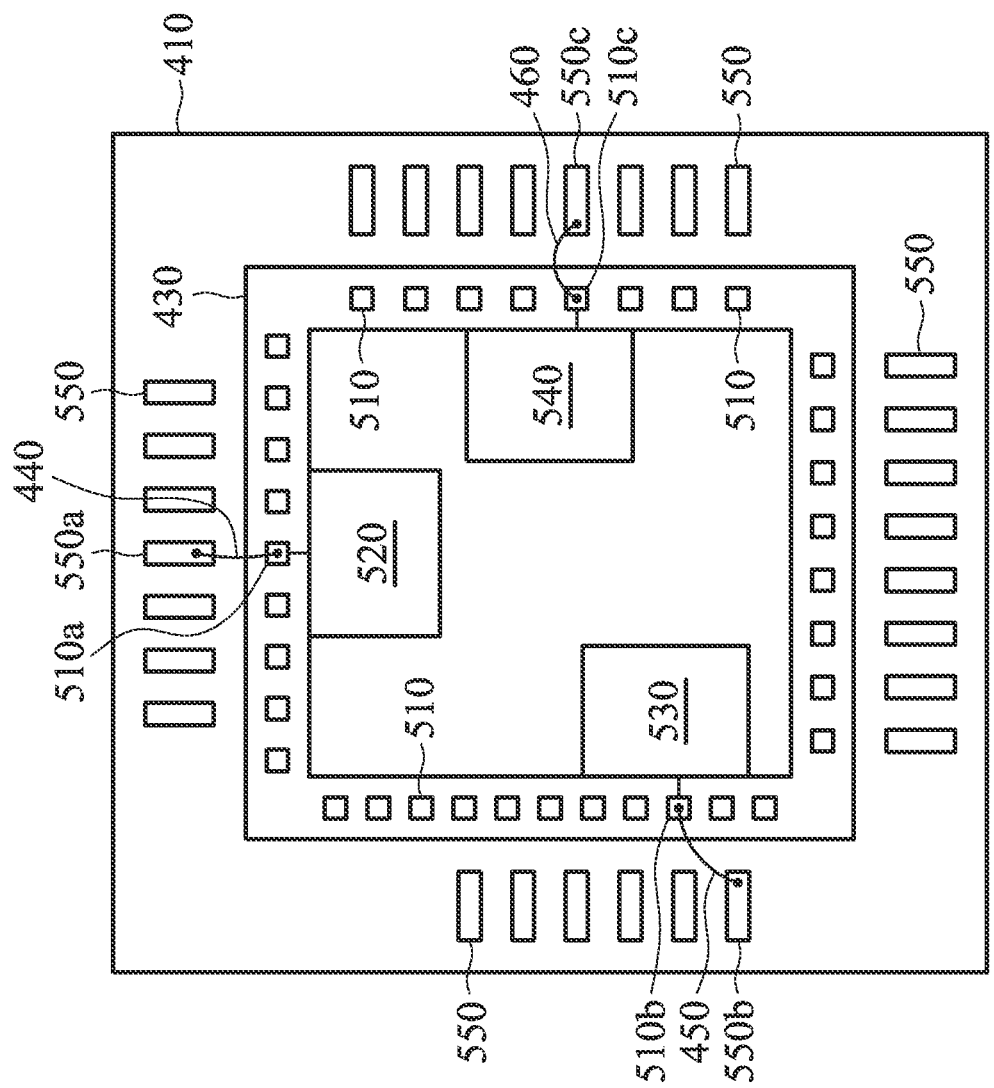
FIG. 5 shows an example illustrating a top view of the semiconductor chip package of FIG. 4.

FIG. 5 shows an example illustrating a top view of the semiconductor chip package 400 of FIG. 4. In FIG. 5, the semiconductor chip 430 includes a plurality of pads 510, a first circuit 520, a second circuit 530 and a third circuit 540. The semiconductor chip package 400 further includes a plurality of contact pads 550 disposed on the package substrate 410. The first circuit 520 is used to provide a reference signal REF to the second circuit 530 and the third circuit 540 via the package substrate 410. In the embodiment, the bonding wire 440 is coupled between a specific contact pad (labeled as 550a) among the contact pads 550 and a specific pad (labeled as 510a) among the pads 510, wherein the pad 510a is coupled to the first circuit 520 for transmitting the reference signal REF from the first circuit 520 to the contact pad 550a via the bonding wire 440. The bonding wire 450 is coupled between a specific contact pad (labeled as 550b) among the contact pads 550 and a specific pad (labeled as 510b) among the pads 510, wherein the pad 510b is coupled to the second circuit 530 for transmitting the reference signal REF from the contact pad 550b to the second circuit 530 via the bonding wire 450. The bonding wire 460 is coupled between a specific contact pad (labeled as 550c) among the contact pads 550 and a specific pad (labeled as 510c) among the pads 510, wherein the pad 510c is coupled to the third circuit 540 for transmitting the reference signal REF from the contact pad 550c to the third circuit 540 via the bonding wire 460.

Figure 6:
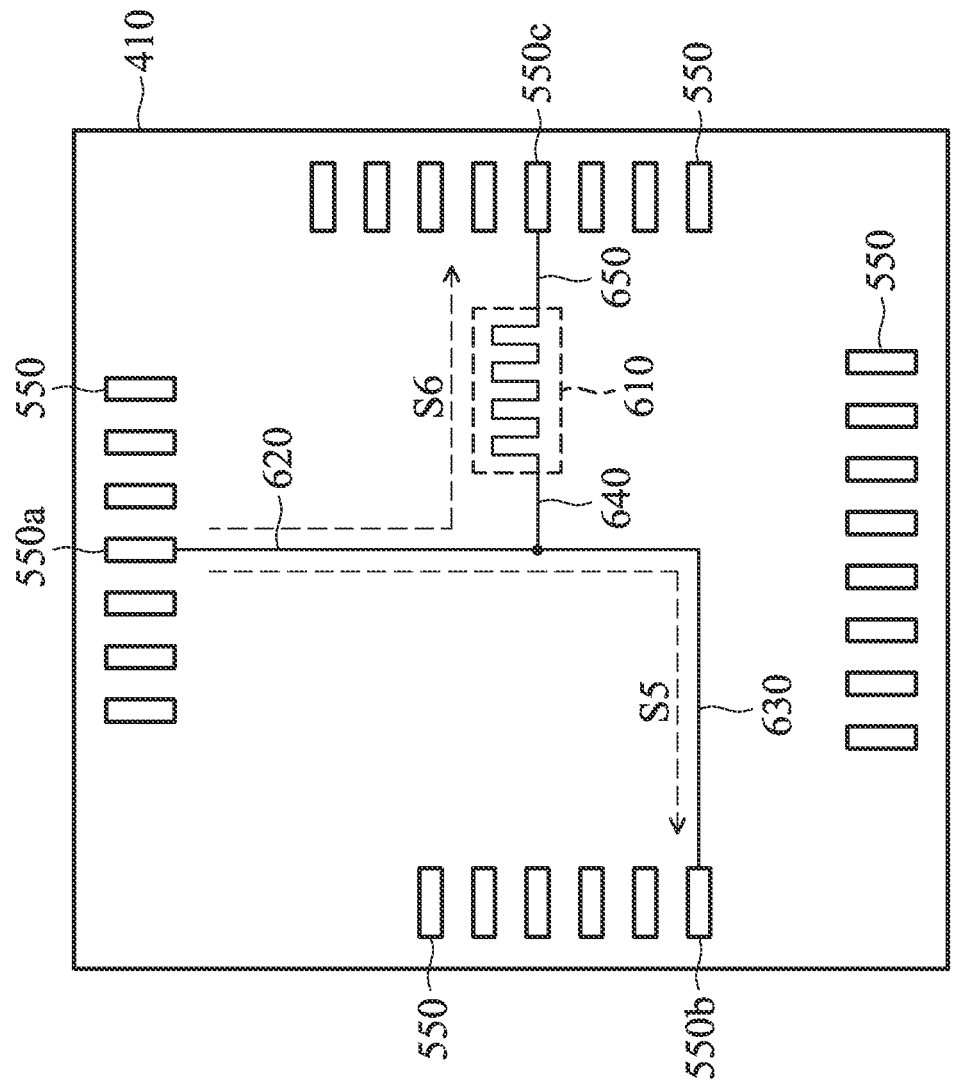
FIG. 6 shows an example illustrating a top view of the package substrate of FIG. 5.

FIG. 6 shows an example illustrating a top view of the package substrate 410 of FIG. 5. Referring to FIG. 4, FIG. 5 and FIG. 6, the transmission line 470 is formed by a delay unit 610 and the conductive traces 620, 630, 640 and 650, wherein the transmission line 470 is used to transmit the reference signal REF from the contact pad 550a to the contact pads 550b and 550c. Therefore, the reference signal REF is transmitted to the second circuit 530 from the first circuit 520 via the pad 510a, the bonding wire 440, the contact pad 550a, a signal path S5, the contact pad 550b, the bonding wire 450 and the pad 510b in sequence, wherein the signal path S5 is formed by the conductive traces 620 and 630. Furthermore, the reference signal REF is transmitted to the third circuit 540 from the first circuit 520 via the pad 510a, the bonding wire 440, the contact pad 550a, a signal path S6, the contact pad 550c, the bonding wire 460 and the pad 510c in sequence, wherein the signal path S6 is formed by the conductive trace 620, a conductive trace 640, a delay unit 610 and a conductive trace 650. In the embodiment, the shortest layout path between the contact pads 550a and 550b is longer than the shortest layout path between the contact pads 550a and 550c, thus the delay unit 610 is used to delay the transmission of the reference signal REF in the signal path S6, such that the reference signal REF can reach the second circuit 530 and the third circuit 540 simultaneously. Specifically, the timing skews of the signal paths S5 and S6 are balanced and the signal paths S5 and S6 are routed globally. In the embodiment, the trace 620 is a common section of the signal paths S5 and S6. Moreover, the delay unit 610 includes a snake-shaped trace, wherein the snake-shaped trace is a conductive line formed as a snake-shaped structure having a plurality of sections, wherein a quantity of the sections is determined according to the difference between the trace 630 and the sum of the traces 640 and 650. As described above, if the shortest layout path between the contact pads 550a and 550b is substantially equal to the shortest layout path between the contact pads 550a and 550c, the delay unit 610 can be removed from the signal path S6. Furthermore, it is to be noted that the relationship of lengths of the bonding wires 440, 450 and 460 of FIG. 4 or FIG. 5 serves as illustrative purposes and should not limit the scope of the invention.

For the embodiment presented in FIG. 5 and FIG. 6, it still has to be mentioned that various modifications as suggested in the embodiments of the modifications in FIG. 1 may be applied whenever appropriate. For example, when the lengths of the paths S5 and S6 are substantially the same, the delay unit 610 may be removed but the timing skews are still balanced. Besides, there are several ways of utilizing the package substrate for timing balance other than using the aforementioned bonding wire approach. Among one of them is the flip chip technology. Please refer to FIG. 5 and FIG. 6 again and focus on the reference signal REF transmission from the first circuit 520 to the third circuit 540. By using bonding wire, the reference signal REF is transmitted to the third circuit 540 from the first circuit 520 via the pad 510a, the bonding wire 440, the contact pad 550a, the signal path S6, the contact pad 550c, the bonding wire 460, and finally the pad 510c. In contrast, by using flip chip approach, the bonding wires 440 and 460 may be removed. Also, the contact pad 550a and 550c may be no longer necessary. Instead, a first connection unit, e.g. a first bump, is disposed to directly connect the pad 510a to the package substrate 410 and a third connection unit, e.g. a third bump, is disposed to directly connect the pad 510c to the package substrate. In this way, the signal path S6 may transmit the reference signal REF from the first bump coupled to the pad 510a of the first circuit to the third bump coupled to the pad 510c of the second circuit 530. The reference signal REF transmission from the first circuit 520 to the second circuit 530 can be implemented in the similar manner and the signal path S5 may transmit the reference signal REF from the first bump coupled to the pad 510a of the first circuit to a second bump coupled to the pad 510b. As the above description is apparent to those skilled in the pertinent art, FIG. 5 and FIG. 6 are not redrawn to illustrate the approach of flip chip for the sake of brevity.

According to the embodiments, by using the signal paths (e.g. S1 and S2 of FIG. 1 or S3 and S4 of FIG. 2) in a semiconductor chip or the signal paths (e.g. 470 of FIG. 4) implemented in a package substrate, the clock skew of the reference signal can be controlled without clock tree synthesis, and the conductive traces and the delay unit have a tiny variance in different process voltage temperature (PVT) corners. Thus, the design of the semiconductor chip is more reliable, and a great timing margin is obtained.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor chip, comprising:
a first circuit, providing a reference signal;
a second circuit;
a third circuit;
a first signal path, comprising a first conductive trace, wherein the reference signal is transmitted from the first circuit to the second circuit via the first signal path; and
a second signal path, wherein the reference signal is transmitted from the first circuit to the third circuit via the second signal path,
wherein timing skews of the first and second signal paths are balanced for the reference signal, and the first and second signal paths are routed globally,
wherein the first, second and third circuits are disposed inside an integrated circuit region, and the first and second signal paths are disposed in a margin area between a boundary of the semiconductor chip and a boundary of the integrated circuit region.

2. The semiconductor chip as claimed in claim 1, wherein the second signal path comprises a second conductive trace, wherein the lengths of the first and second conductive traces are substantially the same.

3. The semiconductor chip as claimed in claim 2, wherein the first signal path and the second signal path further comprise a common conductive trace.

4. The semiconductor chip as claimed in claim 1, wherein the second signal path is formed by a second conductive trace and a delay unit, wherein length of the second conductive trace is different from length of the first conductive trace.

5. The semiconductor chip as claimed in claim 4, wherein the first signal path and the second signal path further comprise a common conductive trace.

6. The semiconductor chip as claimed in claim 4, wherein the delay unit is selective from one of a snake-shaped conductive trace, a buffer chain and a low pass filter.

7. The semiconductor chip as claimed in claim 1, wherein the first and second signal paths are disposed outside the integrated circuit region.

8. The semiconductor chip as claimed in claim 7, further comprising:
a shielding region surrounding the first and second signal paths.

9. The semiconductor chip as claimed in claim 1, wherein the first, second and third circuits are disposed on different edges of the integrated circuit region.

10. The semiconductor chip as claimed in claim 1, wherein the reference signal is a clock source.

11. A semiconductor chip package, comprising:
a package substrate, comprising:
a first contact pad;
a second contact pad; and
a third contact pad; and
a single semiconductor chip mounted on the package substrate, comprising:
a first pad;
a second pad;
a third pad;
wherein the first pad, second pad, and third pad surround the periphery of the single semiconductor chip;
a first circuit coupled to the first contact pad through the first pad and a first connection unit for providing a reference signal;
a second circuit coupled to the second contact pad through the second pad and a second connection unit; and
a third circuit coupled to the third contact pad through the third pad and a third connection unit;
wherein the package substrate further comprises:
a first signal path, wherein the reference signal is transmitted from the first contact pad to the second contact pad via the first signal path; and
a second signal path, wherein the reference signal is transmitted from the first contact pad to the third contact pad via the second signal path;
wherein timing skews of the first and second signal paths are balanced for the reference signal.

12. The semiconductor chip package as claimed in claim 11, wherein the first connection unit comprises a first bump, the second connection unit comprises a second bump and the third connection unit comprises a third bump.

13. The semiconductor chip package as claimed in claim 11, wherein the first connection unit comprises a first bonding wire, the second connection unit comprises a second bonding wire and the third connection unit comprises a third bonding wire.

14. The semiconductor chip package as claimed in claim 11, wherein the first signal path comprises a first conductive trace, and the second signal path comprises a second conductive trace, wherein lengths of the first and second conductive traces are substantially the same.

15. The semiconductor chip package as claimed in claim 11, wherein the first signal path and the second signal path further comprises a common conductive trace.

16. The semiconductor chip package as claimed in claim 11, wherein the first signal path comprises a first conductive trace, and the second signal path comprises a second conductive trace and a delay unit, wherein length of the second conductive trace is different from length of the first conductive trace.

17. The semiconductor chip package as claimed in claim 16, wherein the delay unit comprises a snake-shaped conductive trace.

18. The semiconductor chip package as claimed in claim 11, wherein the first, second and third pads are disposed on different edges of the single semiconductor chip.

19. The semiconductor chip package as claimed in claim 11, wherein the reference signal is a clock source.

* * * * *